United States Patent
Majumdar et al.

(10) Patent No.: US 6,452,365 B1
(45) Date of Patent: Sep. 17, 2002

(54) POWER CONVERTER WITH INCREASED BREAKDOWN VOLTAGE MAINTAINING STABLE OPERATION

(75) Inventors: Gourab Majumdar; Shinji Hatae; Kousuke Yoshimura, all of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/927,258

(22) Filed: Aug. 13, 2001

(30) Foreign Application Priority Data

Mar. 13, 2001 (JP) .................................... 2001-070261

(51) Int. Cl.[7] ............................................. H02M 3/158
(52) U.S. Cl. ........................ 323/223; 323/271; 323/351
(58) Field of Search .................................. 323/223, 224, 323/271, 282, 351

(56) References Cited

U.S. PATENT DOCUMENTS

| | | | |
|---|---|---|---|
| 5,514,981 A | 5/1996 | Tam et al. ...................... 326/80 |
| 5,903,139 A | * 5/1999 | Kompelien .................. 323/282 |
| 5,959,442 A | * 9/1999 | Hallberg et al. ............. 323/282 |
| 6,005,366 A | 12/1999 | Majumdar et al. ........... 318/811 |
| 6,060,868 A | * 5/2000 | Mazzorin ..................... 323/224 |
| 6,087,817 A | * 7/2000 | Varga .......................... 323/282 |
| 6,229,288 B1 | * 5/2001 | Baretich et al. ............. 323/223 |
| 6,262,564 B1 | * 7/2001 | Kanamori .................... 323/271 |

FOREIGN PATENT DOCUMENTS

| | | |
|---|---|---|
| JP | 5-316755 | 11/1993 |
| JP | 11-186884 | 7/1999 |

* cited by examiner

*Primary Examiner*—Jeffrey Sterrett
(74) *Attorney, Agent, or Firm*—Oblon, Spivak, McClelland, Maier & Neustadt, P.C.

(57) ABSTRACT

It is an object to enhance a breakdown voltage without requiring a complicated manufacturing process while maintaining a stable operation. A control signal (A) output from an MCU (11) is transmitted to a driving circuit (3a) for driving a power switching element (1a) of an upper arm through two-stage level shift circuits. The level shift circuit in a first stage is constituted by a series circuit of a switching element (13) and a resistive element (14), and the level shift circuit in a second stage is constituted by a series circuit of a switching element (16) and a resistive element (17).

13 Claims, 16 Drawing Sheets

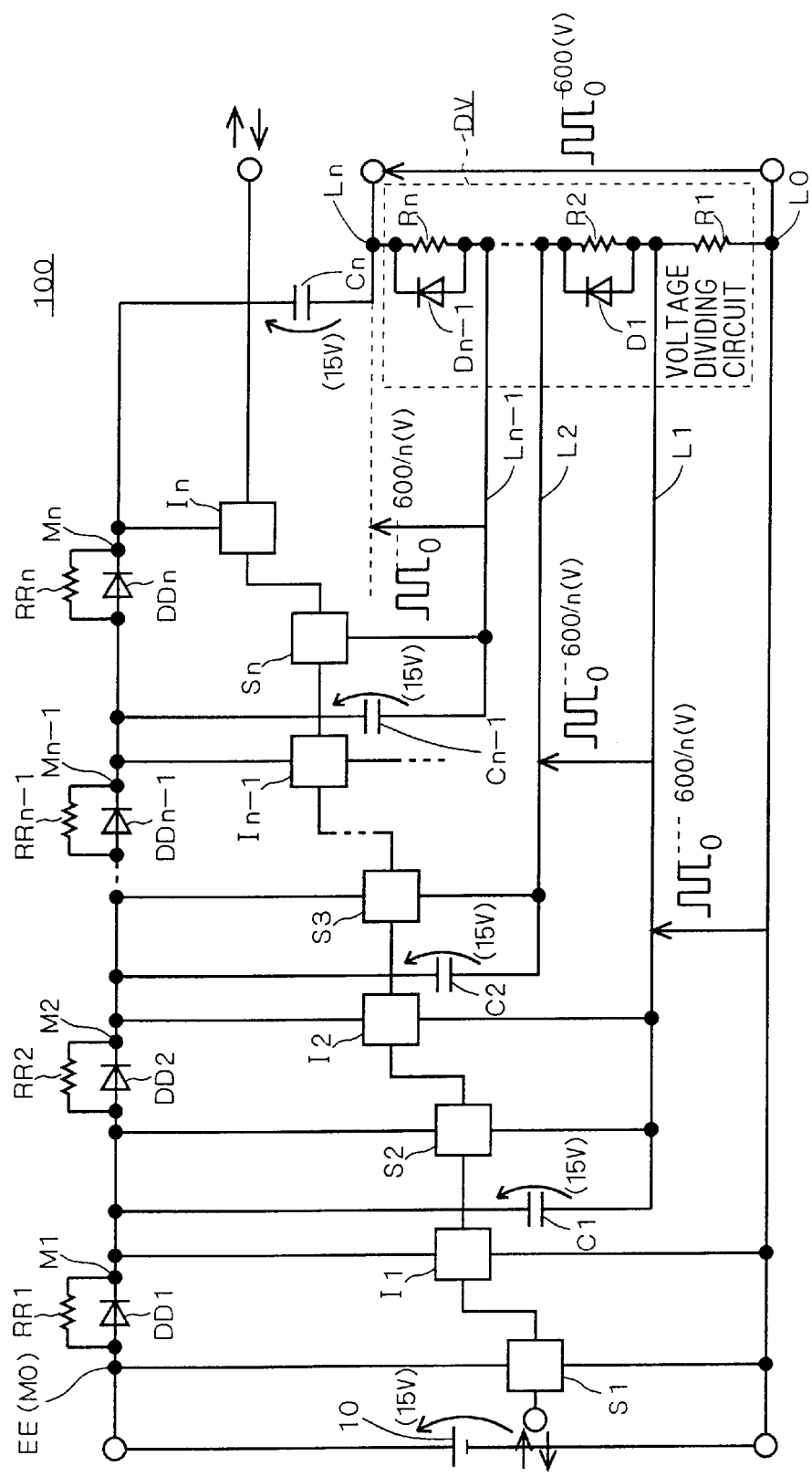
F I G. 1

POWER CONVERTER WITH INCREASED BREAKDOWN VOLTAGE MAINTAINING STABLE OPERATION

BACKGROUND OF THE INVENTION

1. Field of the Invention

The present invention relates to a power converter to be suitably utilized for an inverter and a signal level converter to be suitably utilized for the power converter and more particularly to an improvement for increasing a breakdown voltage of the device without requiring a complicated manufacturing process while maintaining a stable operation.

2. Description of the Background Art

In a signal level converting circuit to function as an interface between a power switching element and an MPU (microcomputer) for driving and controlling the power switching element, conventionally, a photocoupler has been used for electrical insulation. In recent years, however, an HVIC (High Voltage Integrated Circuit) has been used because of advantages such as a small size, a low cost and a long lifetime.

FIG. 16 is a block diagram showing a conventional inverter using the HVIC. An inverter 150 comprises three power converters 151 to 153 having the same structure. The three power converters 151 to 153 share each of three-phase outputs U, V and W. Each of the power converters 151 to 153 is provided between a high potential power line PP and a low potential power line (grounding conductor) NN and receives the supply of a d.c. source voltage from an external power source 165. Moreover, a control signal is input from an external microcomputer 160 to each of the power converters 151 to 153.

The power converter 151 includes power switching elements 172 and 173, free wheel diodes 174 and 175, a capacitor 170 and an HVIC (High Voltage Integrated Circuit) 154. In an example of FIG. 16, the power switching elements 172 and 173 are IGBTs (Insulated Gate Bipolar Transistors). A load is connected through a wiring OUT (U) to a connecting portion of the power switching elements 172 and 173 connected to each other in series.

The HVIC 154 includes a buffer 166, driving circuits 169 and 171, a switching element 167 and a resistive element 168. In the example of FIG. 16, the switching element 167 is an N-channel type high voltage MOSFET. A source voltage is supplied from an external d.c. power source 161 to the buffer 166 and the driving circuit 171. A voltage held by the capacitor 170 is supplied as a source voltage to a driving circuit 169 changing a source potential together with the wiring OUT (U). When the power switching element 173 is turned ON or OFF, the d.c. power source 161 repetitively charges the capacitor 170 through a resistive element 163 and a diode 164.

A level of a signal to be transmitted is varied between the buffer 166 and the driving circuit 169. A series circuit of the switching element 167 and the resistive element 168 which is provided between the buffer 166 and the driving circuit 169 functions as a level shift circuit for converting a level of a signal between the buffer 166 and the driving circuit 169. Accordingly, a breakdown voltage which is equal to or higher than that of the power switching element 172 is required for the switching element 167.

The HVIC has problems, for example, if a breakdown voltage becomes higher, a manufacturing process is more complicated, a manufacturing apparatus is to be introduced newly, a malfunction of the HVIC itself cannot be prevented easily, and the like. In the HVIC, a technique for isolating a low voltage portion from a high voltage portion is a key technology. A junction isolation technique and a dielectric isolation technique have been known as the isolation technique. In the junction isolation technique, an isolation island is formed of an isolating $p^+$ layer by using a method standardly utilized in a normal IC or LSI, and an element or a circuit as an element group is formed on the inside thereof. In the dielectric isolation technique, each of single crystal silicon islands forming each element or circuit is surrounded by a dielectric (for example, a polycrystalline silicon). Consequently, the islands are electrically insulated from each other.

The junction isolation technique has such an advantage as to be carried out by a conventional IC manufacturing apparatus. In some cases, however, a noise current flows to a floating capacitance in an isolation region through dv/dt (a rate of change in a voltage) during a switching operation so that an operation of the circuit is affected. There is a problem in that the phenomenon presents itself more remarkably when a breakdown voltage is increased. The dielectric isolation technique includes a special process such as the bonding of a silicon substrate. Therefore, there is a problem in that a manufacturing process is complicated and a cost per unit chip area is increased. In addition, as a breakdown voltage is more increased, the manufacturing process becomes more complicated so that the cost is more increased.

Up to the present, an HVIC having a breakdown voltage of 600 V has been put on the market. However, if the breakdown voltage is to be more increased, the above-mentioned problems actually arise. Therefore, an increase in the breakdown voltage of the HVIC has not been implemented.

SUMMARY OF THE INVENTION

In order to solve the above-mentioned problems in the conventional art, it is an object of the present invention to provide a power converter and a signal level converter which can increase a breakdown voltage without requiring a complicated manufacturing process while maintaining a stable operation.

A first aspect of the present invention is directed to a power converter comprising a first switching element having first and second main electrodes, a second switching element having third and fourth main electrodes, the fourth main electrode being connected to the first main electrode, a first driving circuit to drive the first switching element based on a first control signal input from an outside, a second, driving circuit to drive the second switching element based on a second control signal input from an outside, and n level shift circuits connected in cascade in n stages, the n being an integer of 2 or more, and configured to level shift the first control signal in the n stages and to transmit the level shifted signal to the first driving circuit.

A second aspect of the present invention is directed to the power converter according to the first aspect of the present invention, further comprising a sense circuit to detect an operation state of the first switching element and to output a detection signal representing the operation state, and n other level shift circuits connected in cascade in n stages and configured to level shift the detection signal in the n stages and to transmit the level shifted signal to an outside.

A third aspect of the present invention is directed to the power converter according to the second aspect of the present invention, further comprising a one-shot pulse circuit connected to an input of each of the n other level shift circuits, and a latch circuit connected to an output of each of the n other level shift circuits.

A fourth aspect of the present invention is directed to the power converter according to any of the first to third aspects of the present invention, further comprising a one-shot pulse circuit connected to an input of each of the n level shift circuits, and a latch circuit connected to an output of each of the n level shift circuits.

A fifth aspect of the present invention is directed to the power converter according to any of the first to fourth aspects of the present invention, wherein each of the n level shift circuits includes a resistive element and a switching element which are connected to each other in series.

A sixth aspect of the present invention is directed to the power converter according to the second aspect of the present invention, wherein each of the n other level shift circuits includes a resistive element and a switching element which are connected to each other in series.

A seventh aspect of the present invention is directed to the power converter according to any of the first to sixth aspects of the present invention, further comprising a voltage dividing circuit having one end connected to the third main electrode and the other end connected to the first main electrode and configured to divide an electric potential of the one end and an electric potential of the other end, thereby outputting first to (n−1)th intermediate potentials, first to nth diodes connected to each other in series in the same direction, and first to nth capacitors, wherein one end of the first to nth capacitors are respectively connected to one electrode of the first to nth diodes, and the other end of the first to nth capacitors are connected to an output of the first to (n−1)th intermediate potentials and the first main electrode, respectively.

An eighth aspect of the present invention is directed to the power converter according to the seventh aspect of the present invention, wherein the voltage dividing circuit includes first to nth resistive elements which are connected to each other in series, and the first to (n−1)th intermediate potentials are output from (n−1) connecting portions from the first to nth resistive elements, respectively.

A ninth aspect of the present invention is directed to the power converter according to the eighth aspect of the present invention, further comprising (n−1) diodes connected to the second to nth resistive elements in parallel, respectively.

A tenth aspect of the present invention is directed to the power converter according to any of the seventh to ninth aspects of the present invention, further comprising n diodes connected to each other in series, a pair of power terminals of the first driving circuit being connected to the one end of the nth capacitor and the other end thereof, respectively, and one of a pair of power terminals of the second driving circuit being connected to the third main electrode and the other of the pair of the, power terminals being connected to one end of a series circuit of the n diodes.

An eleventh aspect of the present invention is directed to the power converter according to any of the seventh to tenth aspects of the present invention, further comprising n resistive elements connected to the first to nth diodes in parallel, respectively.

A twelfth aspect of the present invention is directed to the power converter according to any of the seventh to eleventh aspects of the present invention, further comprising another resistive element connected to the first diode in series.

A thirteenth aspect of the present invention is directed to the power converter according to any of the first to twelfth aspects of the present invention, further comprising first and second free wheel diodes connected to the first and second switching elements in antiparallel, respectively.

A fourteenth aspect of the present invention is directed to a signal level converter comprising a voltage dividing circuit having one end connected to a first potential line to transmit a first potential and the other end connected to a second potential line to transmit a second potential and configured to divide the first potential and the second potential, thereby outputting first to (n−1)th intermediate potentials, first to nth diodes connected to each other in series in the same direction, first to nth capacitors, which have one end respectively connected to one electrode of the first to nth diodes and the other end respectively connected to an output of the first to (n−1)th intermediate potentials and the second potential line, and n level shift circuits connected in cascade in n stages, the n being an integer of 2 or more, and configured to level shift one of a signal based on the first potential and a signal based on the second potential in n stages and to thereby convert the same into the other signal.

A fifteenth aspect of the present invention is directed to the signal level converter according to the fourteenth aspect of the present invention, further comprising a one-shot pulse circuit connected to an input of each of the n level shift circuits, and a latch circuit connected to an output of each of the n level shift circuits.

A sixteenth aspect of the present invention is directed to the signal level converter according to any of the fourteenth to fifteenth aspects of the present invention, wherein each of the n level shift circuits includes a resistive element and a switching element which are connected to each other in series.

A seventeenth aspect of the present invention is directed to the signal level converter according to any of the fourteenth to sixteenth aspects of the present invention, wherein the voltage dividing circuit includes first to nth resistive elements which are connected to each other in series, and the first to (n−1)th intermediate potentials are output from (n−1) connecting portions from the first to nth resistive elements, respectively.

An eighteenth aspect of the present invention is directed to the signal level converter according to the seventeenth aspect of the present invention, further comprising (n−1) diodes connected to the second to nth resistive elements in parallel, respectively.

A nineteenth aspect of the present invention is directed to the signal level converter according to any of the fourteenth to eighteenth aspects of the present invention, further comprising n resistive elements connected to the first to nth diodes in parallel, respectively.

A twentieth aspect of the present invention is directed to the signal level converter according to any of the fourteenth to nineteenth aspects of the present invention, further comprising another resistive element connected to the first diode in series.

According to the first aspect of the present invention, the control signal is level shifted in a plurality of stages. Therefore, it is possible to raise the breakdown voltage of the device without increasing a breakdown voltage required for each of the level shift circuits. Since a high breakdown voltage is not required for each of the level shift circuits, it is possible to enhance the breakdown voltage of the device without requiring a complicated manufacturing process while maintaining a stable operation.

According to the second aspect of the present invention, the detection signal is level shifted in a plurality of stages.

Therefore, it is possible to increase the breakdown voltage of the device shift circuits and to transmit an operation state of the switching element (for example, a current and a temperature) to an external device without raising the breakdown voltage required for each of the level.

According to the third aspect of the present invention, the detection signal is converted into a one-shot pulse form and is then level shifted, and is restored to have an original waveform by the latch circuit. Therefore, it is possible to achieve the level shift of the detection signal while reducing a power loss in the level shift circuit.

According to the fourth aspect of the present invention, the control signal is converted into a one-shot pulse form and is then level shifted, and is restored to have an original waveform by the latch circuit. Therefore, it is possible to achieve the level shift of the control signal while reducing a power loss in the level shift circuit.

According to the fifth aspect of the present invention, each level shift circuit is simply constituted by using the resistive element and the switching element which are connected to each other in series.

According to the sixth aspect of the present invention, each level shift circuit is simply constituted by using the resistive element and the switching element which are connected to each other in series.

According to the seventh aspect of the present invention, the source potentials of the first driving circuit and the n level shift circuits are generated by a simple structure using the voltage dividing circuit, the first to nth diodes, and the first to nth capacitors.

According to the eighth aspect of the present invention, the voltage dividing circuit is simply constituted by using the first to nth resistive elements which are connected to each other in series.

According to the ninth aspect of the present invention, the (n−1) diodes are connected to the second to nth resistive elements in parallel with each other. Therefore, a high speed switching operation can be implemented more stably.

According to the tenth aspect of the present invention, the n diodes connected to each other in series are connected to one of the power terminals of the second driving circuit. Therefore, it is possible to eliminate a difference between the source voltage of the first driving circuit and the source voltage of the second driving circuit which arises from forward voltages of the first to nth diodes.

According to the eleventh aspect of the present invention, the n resistive elements are connected to the first to nth diodes in parallel. Therefore, the high speed switching operation can be implemented more stably.

According to the twelfth aspect of the present invention, the resistive element is connected to the first diode in series. Therefore, it is possible to reduce a rush current flowing to the first to nth diodes and the first to nth capacitors.

According to the thirteenth aspect of the present invention, the free wheel diode is connected to each of the first and second switching elements. Therefore, it is possible to utilize the device for an inverter or the like without connecting the free wheel diode to an outside.

According to the fourteenth aspect of the present invention, the signal is level shifted in a plurality of stages between the signal based on the first potential and the signal based on the second potential. Therefore, it is possible to increase a level shift range without raising a breakdown voltage required for each of the level shift circuits. In addition, the source potentials of the n level shift circuits are generated by a simple structure using the voltage dividing circuit, the first to nth diodes, and the first to nth capacitors.

According to the fifteenth aspect of the present invention, the signal is converted into a one-shot pulse form and is then level shifted, and is restored to have an original waveform by the latch circuit. Therefore, it is possible to achieve the level shift of the signal while reducing a power loss in the level shift circuit.

According to the sixteenth aspect of the present invention, each level shift circuit is simply constituted by using the resistive element and the switching element which are connected to each other in series.

According to the seventeenth aspect of the present invention, the voltage dividing circuit is simply constituted by using the first to nth resistive elements which are connected to each other in series.

According to the eighteenth aspect of the present invention, the (n−1) diodes are connected to the second to nth resistive elements in parallel. Therefore, also in such a utilization configuration that a difference between the first potential and the second potential is changed at a high speed, the stable operation of the device can be implemented.

According to the nineteenth aspect of the present invention, the n resistive elements are connected to the first to nth diodes in parallel. Therefore, also in such a utilization configuration that a difference between the first potential and the second potential is changed at a high speed, the stable operation of the device can be implemented.

According to the twentieth aspect of the present invention, the resistive element is connected to the first diode in series. Therefore, it is possible to reduce a rush current flowing to the first to nth diodes and the first to nth capacitors.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a circuit diagram showing a signal level converting circuit to be used for a power converter according to each embodiment.

DESCRIPTION OF THE PREFERRED EMBODIMENTS

Summary of Preferred Embodiments

Figure 2:
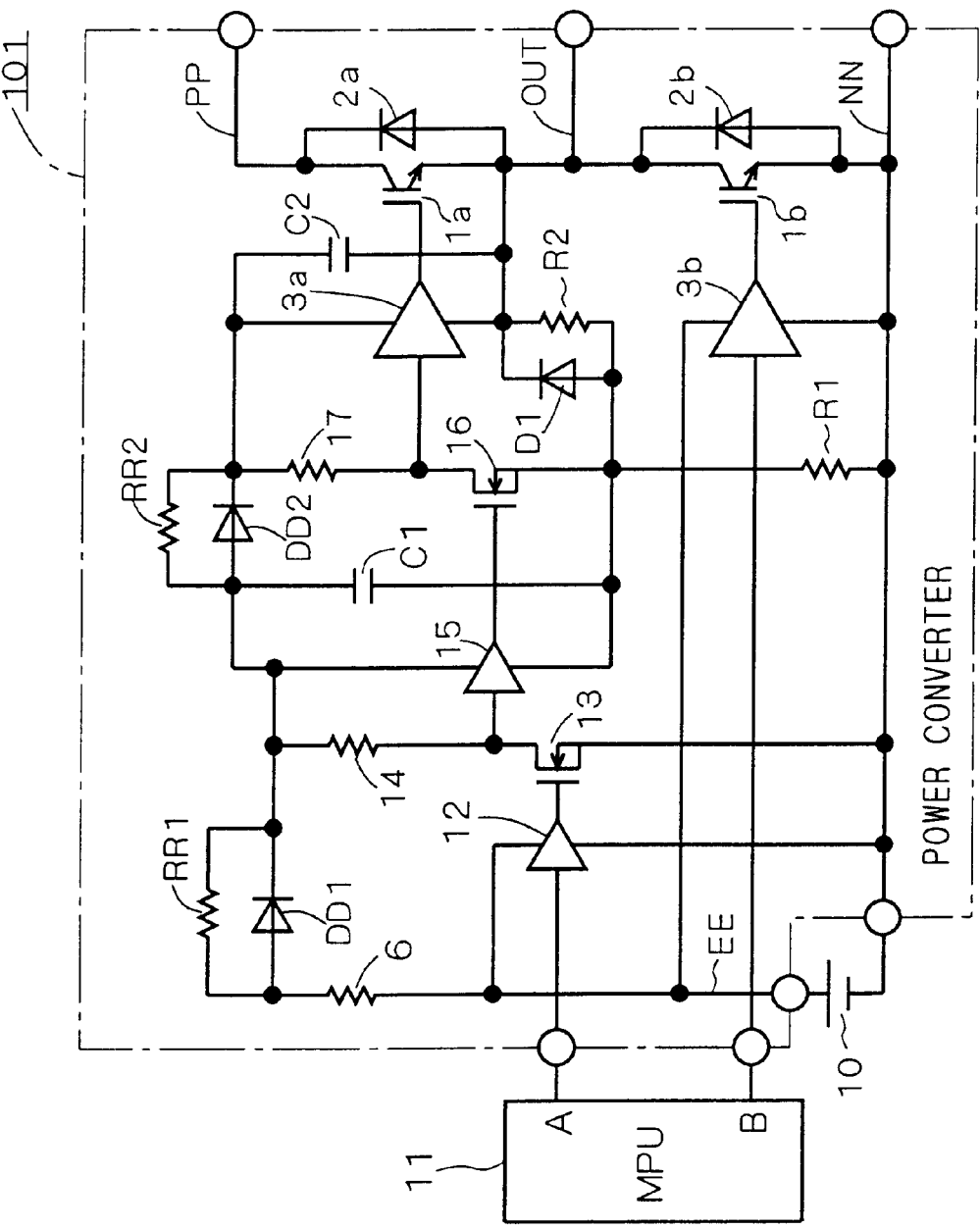
FIG. 2 is a circuit diagram showing a power converter according to a first embodiment.

First of all, description will be given to the outline of a signal level converter to be used in power converters 101 to 110 according to the following embodiments. A signal level converter 100 shown in a circuit diagram of FIG. 1 comprises n level shift circuits I1 to In, n signal transmitting circuits S1 to Sn, n capacitors C1 to Cn, n diodes DD1 to DDn; n resistive elements RR1 to RRn and a voltage dividing circuit DV. The integer n is equal to or greater than 2.

The voltage dividing circuit DV has one of ends connected to an electric potential line L0 for transmitting a first potential and the other end connected to an electric potential line Ln for transmitting a second potential. The first and second potentials are divided to generate first to (n−1)th intermediate potentials and to output them to electric potential lines L1 to L (n−1), respectively. A switching element is connected to the electric potential lines L0 and Ln, for example, so that their difference in an electric potential is repetitively changed between almost 0 volt and a predetermined voltage (which is assumed to be 600 V as an example). Consequently, a space between the first to (n−1)th intermediate potentials is changed within a range of almost 0 V to 600 V/n.

As shown in FIG. 1, preferably, the voltage dividing circuit DV includes n resistive elements R1 to Rn connected to each other in series and (n−1) connecting portions therebetween are connected to the electric potential lines L1 to L (n−1), respectively. More preferably, as shown in FIG. 1, (n−1) diodes D1 to D (n−1) are connected to the resistive elements R2 to Rn in parallel with each other. The diodes D1 to D (n−1) are connected to each other in the same direction.

The diodes DD1 to DDn are connected to each other in series in the same direction. Preferably, the resistive elements RR1 to RRn are connected to the diodes DD1 to DDn in parallel, respectively. A d.c. power source 10 is connected to the electric potential line L0 and an anode of the diode DD1. A d.c. voltage supplied from the d.c. power source 10 (which is assumed to be 15 V as an example) is set to have a much smaller value than a voltage (600 V) applied between the electric potential lines L0 and Ln.

Each of the capacitors C1 to Cn has one of ends connected to each of cathodes of the diodes DD1 to DDn and the other end connected to each of the electric potential lines L1 to Ln. When the electric potential of the electric potential line Ln based on the electric potential of the electric potential line L0 is repetitively changed, the capacitors C1 to Cn are repetitively charged by a current supplied from the d.c. power source 10 through the diodes D1 to Dn. As a result, the capacitors C1 to Cn hold almost constant voltages.

Figure 16:
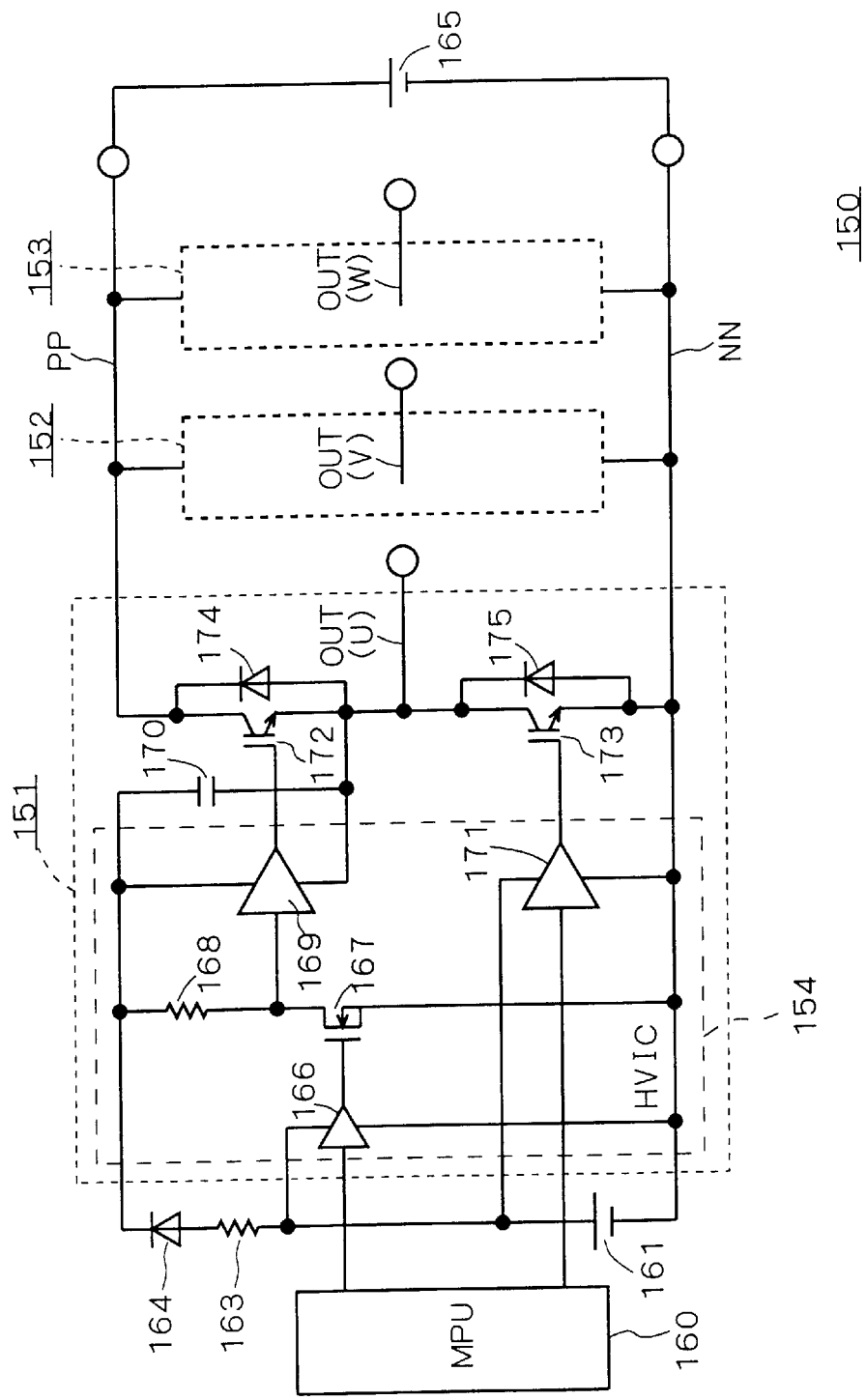
FIG. 16 is a circuit diagram showing an inverter according to the conventional art.

The level shift circuits I1 to In are connected in cascade in n stages so that one of a signal based on the first potential and a signal based on the second potential is level shifted in the n stages and is thus converted into the other signal. A conventional well-known level shift circuit (for example, a series circuit of the switching element 167 and the resistive element 168 in FIG. 16) can be used for each of the level shift circuits I1 to In.

The signal transmitting circuits S1 to Sn are circuits (for example, buffers) for transmitting a signal and are operated upon receipt of the supply of the voltages held by the capacitors C1 to Cn as source voltages, respectively. Accordingly, the source voltages of the signal transmitting circuits S1 to Sn are almost equal to a d.c. voltage (15 V) supplied from the d.c. power source 10 and are almost equivalent to each other. However, the source potentials correspond to the electric potentials of the electric potential lines L0 to Ln respectively, and are different from each other stepwise.

As described above, in the signal level converting circuit 100, the level shift circuits I1 to In level shift the signal stepwise in a plurality of stages. Therefore, it is possible to increase a level shift range without raising a breakdown voltage required for each of the level shift circuits I1 to In. If the number of stages n is greater, the level shift range can be increased. Moreover, the voltage dividing circuit DV, the diodes DD1 to DDn and the capacitors C1 to Cn are used. Therefore, the source voltages of the level shift circuits I1 to In can be obtained with a simple circuit structure. Furthermore, the voltage dividing circuit DV can be constituted more simply by using the resistive elements R1 to Rn. Moreover, the diodes D1 to D (n−1) are connected in parallel with the resistive elements R2 to Rn. Also in such a utilization configuration that a difference between the first potential and the second potential is changed at a high speed, therefore, it is possible to implement the stable operation of the device. Furthermore, the resistive elements RR1 to RRn are connected to the diodes DD1 to DDn in parallel, respectively. Therefore, the stability of the high-speed operation can be enhanced.

It is also possible to achieve the stepwise level shift of a signal with only the level shift circuits I1 to In without providing the transmitting circuits S1 to Sn.

First Embodiment
(Structure and Operation of Device)

FIG. 2 is a circuit diagram showing a structure of a power converter according to a first embodiment. A power converter 101 comprises power switching elements 1a and 1b, free wheel diodes 2a and 2b, driving circuits 3a and 3b, and the signal level converting circuit 100 (FIG. 1). In an example of FIG. 2, the power switching elements 1a and 1b are n-channel type IGBTs. A series circuit having the power switching elements 1a and 1b connected to each other in series is provided between a high potential power line PP and a low potential power line (for example, a grounding line) NN. During the use of the power converter 101, an external power source which is not shown is connected to the high potential power line PP and the low potential power line NN so that a high d.c. source voltage is applied. A load is connected to a connecting portion of the power switching elements 1a and 1b through a wiring OUT. In other words, the power switching elements 1a and 1b belong to upper and lower arms, respectively.

In more detail, one of main electrodes (an emitter in an example of the n-channel type IGBT) of the power switching element 1a is connected to the wiring OUT and the other main electrode (a collector in the example of the n-channel type IGBT) is connected to the high potential power line PP. Moreover, one of main electrodes (the emitter in the example of the n-channel type IGBT) of the power switching element 1b is connected to the low potential power line NN and the other main electrode (the collector in the example of the n-channel type IGBT) is connected to the wiring OUT.

The free wheel diodes 2a and 2b are connected to the power switching elements 1a and 1b in antiparallel, respectively. In this specification, the "antiparallel connection" implies a parallel connection in which an anode and a cathode of a diode are individually connected to a pair of main electrodes of a switching element in such a direction that a forward current can flow like a ring therein. As illustrated in FIG. 2, accordingly, the antiparallel connection of the n-channel type IGBT and the diode implies such a connection that an emitter is connected to an anode and a collector is connected to a cathode. The free wheel diodes 2a and 2b fulfill the function of bypassing a flow-back current.

The power switching elements 1a and 1b receive the supply of a high d.c. source voltage through an external power source (not shown) which is connected to the high potential power line PP and the low potential power line NN during the use of the power converter 101. Outputs of the driving circuits 3a and 3b are connected to control electrodes (gates in the example of the IGBTs) of the power switching elements 1a and 1b so that the driving circuits 3a and 3b drive the power switching elements 1a and 1b, respectively. When the power switching elements 1a and 1b are turned ON or OFF, an electric potential of the wiring OUT is repetitively changed between an electric potential of the low potential power line NN and that of the high potential power line PP.

In the power converter 101, the number of stages n of the signal level converting circuit 100 is 2. The power converter 101 comprises a series circuit of a switching element 13 and a resistive element 14 as the level shift circuit I1 (FIG. 1) and a series circuit of a switching element 16 and a resistive element 17 as the level shift circuit I2. In the example of FIG. 2, the switching elements 13 and 16 are n-channel type high voltage MOSFETs. The power converter 101 further comprises a buffer 12 as the signal transmitting circuit S1 and a buffer 15 as the signal transmitting circuit S2. Moreover, the low potential power line NN and the wiring OUT correspond to the electric potential lines L0 and Ln of the signal level converting circuit 100 (FIG. 1), respectively.

An external d.c. power source 10 and an external microcomputer 11 are further connected to the power converter 101 during use thereof. The buffer 12 and the driving circuit 3b receive the supply of a source voltage from the d.c. power source 10 through the low potential power line NN and a d.c. power line EE. The buffer 15 receives the supply of a source voltage through a voltage held by a capacitor C1, and the driving circuit 3a receives the supply of a source voltage through a voltage held by a capacitor C2. As shown in FIG. 2, preferably, a resistive element 6 is provided between a diode DD1 and the d.c. power line EE. Consequently, a rush current charging the capacitors C1 and C2 can be restricted.

The microcomputer 11 outputs a control signal A for driving the power switching element 1a and a control signal B for driving the power switching element 1b. The control signal A passes through the buffer 12, and is then level shifted through two-stage level shift circuits and is input to the driving circuit 3a. The control signal B is input to the driving circuit 3b.

Since the power converter 101 has the above-mentioned structure, breakdown voltages required for the switching elements 13 and 16 are not raised but a voltage which can be applied between the high potential power line PP and the low potential power line NN, that is, a breakdown voltage of the power converter 101 can be raised. Alternatively, it is possible to use the switching elements 13 and 16 having low breakdown voltages in order to obtain an equivalent breakdown voltage of the device.

(Valid Data)

Figure 3:
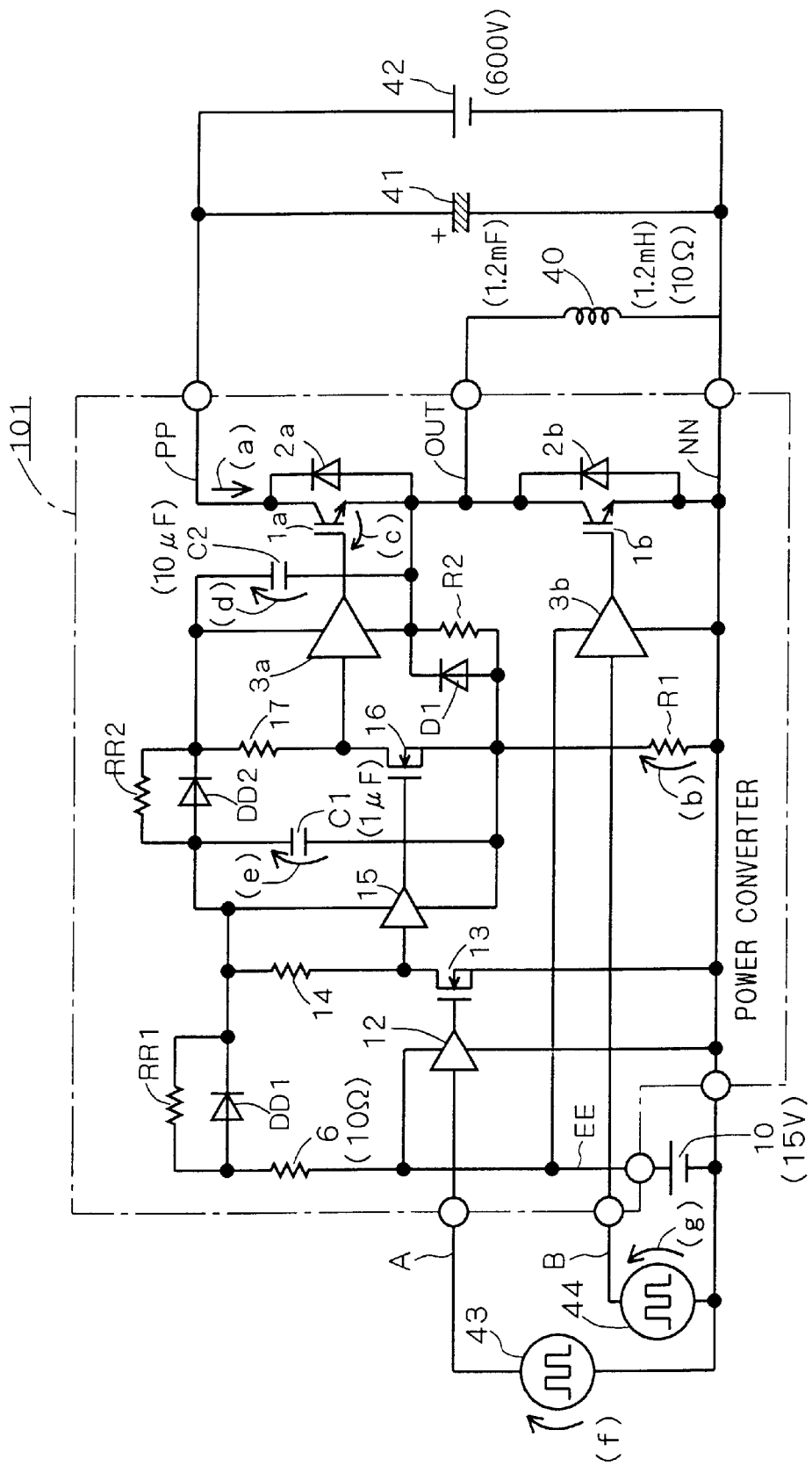
FIG. 3 is a circuit diagram showing conditions used in a verification test for the power converter according to the first embodiment.

Next, description will be given to a verification test carried out for the power converter 101 and valid data thus obtained. FIG. 3 is a circuit diagram showing the power converter 101 illustrating the conditions employed for the verification test. An external power source 42 for outputting a voltage of 600 V is connected to the high potential power line PP and the low potential power line NN. Moreover, a smoothing capacitor 41 is connected to the external power source 42. An inductor 40 having 1.2 mH is connected as a load to the wiring OUT and the low potential power line NN. A d.c. voltage output from the d.c. power source 10 is set to 15 V. Each of the control signals A and B has two values of 0 V (low level) and 15 V (high level). A circuit constant of each element is shown in FIG. 3.

Figure 4:
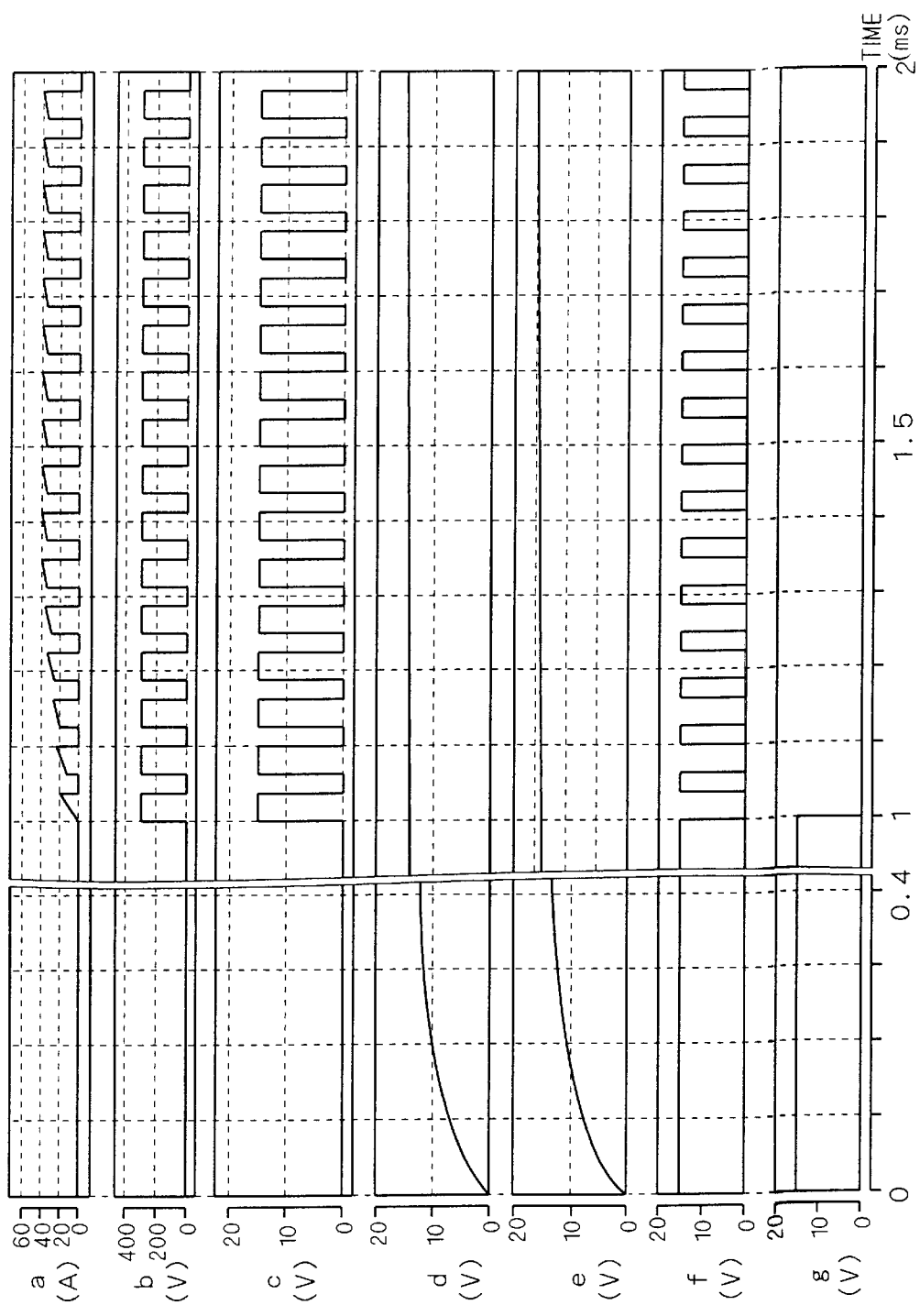
FIG. 4 is a timing chart showing a result of the verification test.

FIG. 4 is a timing chart for a voltage or a current of each of portions (a) to (g) shown in FIG. 3 which is obtained by the verification test. As shown in FIG. 4, when approximately 1 msec passes after a time 0 at which the control signals A and B are activated, both the capacitors C1 and C2 almost complete the charging. Then, also after a switching operation is started, charging voltages of the capacitors C1 and C2 are not changed. As a result, a source voltage of approximately 15 V is stably supplied to the buffer 15 and the driving circuit 3a in the same manner as in the driving circuit 3b. Consequently, a normal switching operation can be implemented. Moreover, a voltage to be applied to the resistive element R1 is a half of 600 V, that is, 300 V. Accordingly, a voltage which is higher than 315 V is not applied to the switching element 13, and furthermore, neither is the switching element 16. Thus, the result of the verification test proves that the power converter 101 can be normally operated under a high voltage without requiring a high breakdown voltage for the level shift circuit.

Second Embodiment

Figure 5:
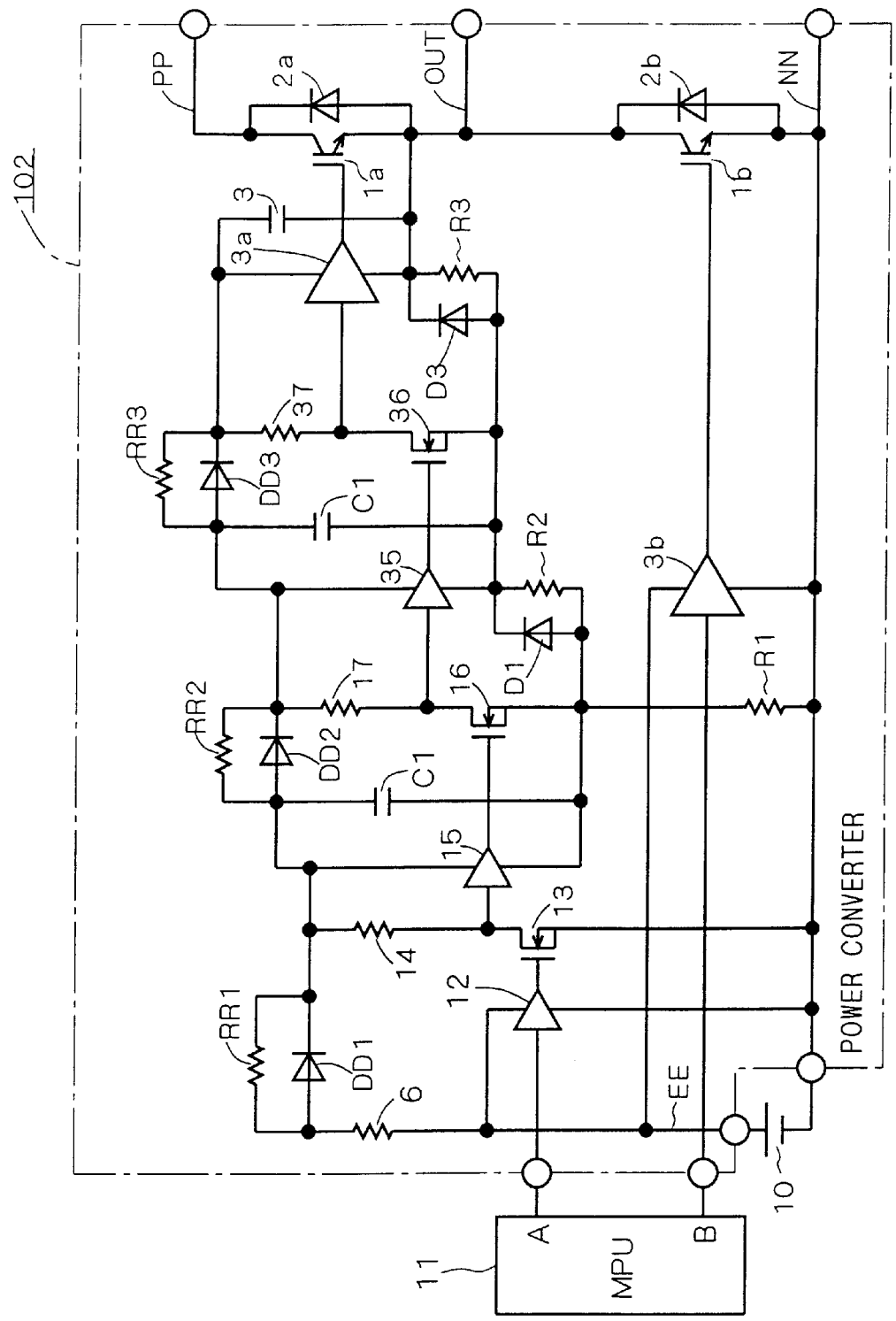
FIG. 5 is a circuit diagram showing a power converter according to a second embodiment.

FIG. 5 is a circuit diagram showing a structure of a power converter according to a second embodiment. A power converter 102 is characteristically different from the power converter 101 in that the number of stages n of the signal level converting circuit 100 (FIG. 1) is set to 3. The power converter 102 comprises a series circuit of a switching element 36 and a resistive element 37 as the level shift circuit I3 (FIG. 1) and a buffer 35 as the signal transmitting circuit S3. Even if a level shift circuit having an equal breakdown voltage is used, a source voltage which is approximately 1.5 times as high as that of the power converter 101 can be applied to the high potential power line PP and the low potential power line NN in the power converter 102.

Third Embodiment

Figure 6:
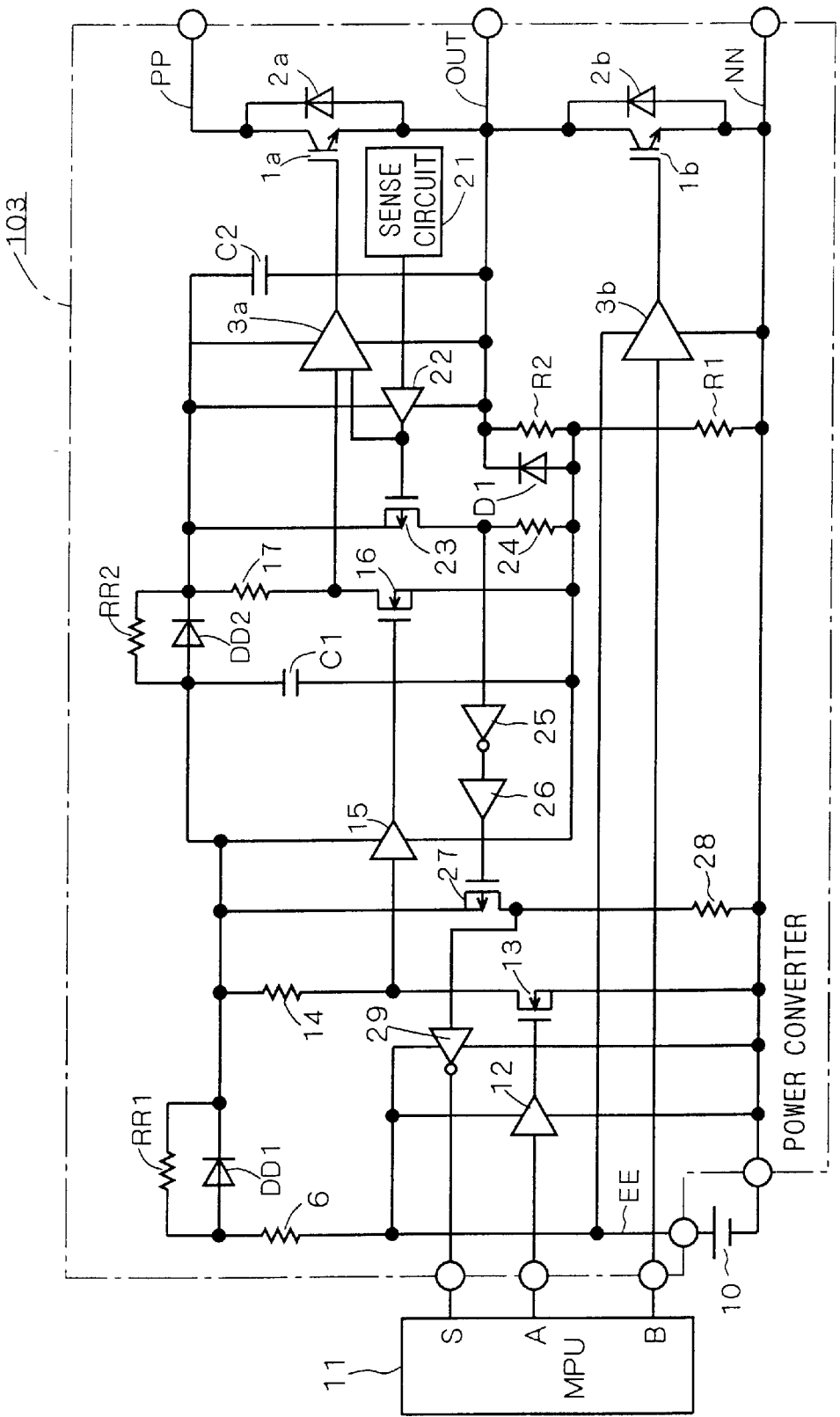
FIG. 6 is a circuit diagram showing a power converter according to a third embodiment.

FIG. 6 is a circuit diagram showing a structure of a power converter according to a third embodiment. A power converter 103 is characteristically different from the power converter 101 in that it comprises a sense circuit 21 for detecting an operation state of the power switching element 1a and for outputting a detection signal representing the operation state, and another level shift circuit for level shifting the detection signal in two stages and transmitting the same signal to the microcomputer 11. The sense circuit 21 detects a magnitude of a current flowing to the power switching element 1a, a temperature of the power switching element 1a and the like, for example. The microcomputer 11 can monitor the operation state of the switching element 1a through the detection signal.

The sense circuit 21 receives the supply of a source voltage through a voltage held by a capacitor C2 in the same manner as a driving circuit 3a. Accordingly, the sense circuit 21 outputs the detection signal as a signal based on an electric potential of a wiring OUT. The level shift circuit for transmitting the detection signal carries out a level shift in a reverse direction to the level shift circuit for transmitting a control signal A. In other words, the power converter 103 comprises a series circuit of a switching element 27 and a resistive element 28 in addition to a series circuit of the switching element 13 and the resistive element 14 as the level shift circuit I1 (FIG. 1), and a series circuit of a switching element 23 and a resistive element 24 in addition to a series circuit of the switching element 16 and the resistive element 17 as the level shift circuit I2. In an example of FIG. 6, the switching elements 23 and 27 are p-channel type high voltage MOSFETs.

The power converter 103 further comprises an inverter 29 in addition to the buffer 12 as the signal transmitting circuit S1 and an inverter 25 and a buffer 26 in addition to the buffer 15 as the signal transmitting circuit S2. The detection signal output from the sense circuit 21 is input to both the switching element 23 and the driving circuit 3a through a buffer 22. When a value of the detection signal exceeds a predetermined range, the driving circuit 3a drives the power switching element 1a to be turned OFF.

A voltage to be applied between a high potential power line PP and a low potential power line NN can be increased with a breakdown voltage maintained to be as low for the switching elements 23 and 27 to be used in the power converter 103, as for the switching elements 13 and 16. Alternatively, it is possible to use an element having a low breakdown voltage as the switching elements 12, 16, 23 and 27 in order to obtain the equivalent breakdown voltage of the device.

Fourth Embodiment

Figure 7:
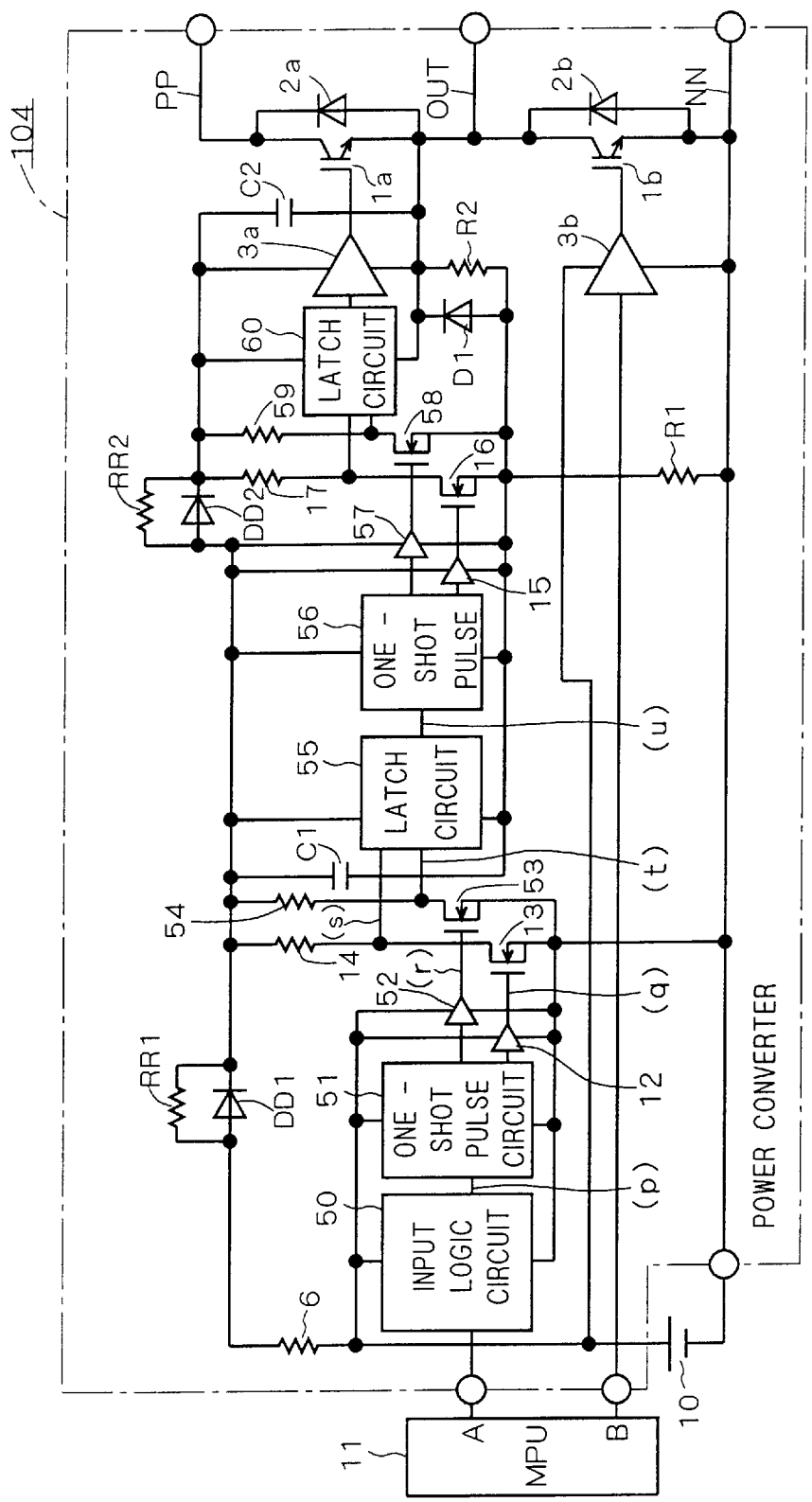
FIG. 7 is a circuit diagram showing a power converter according to a fourth embodiment.

FIG. 7 is a circuit diagram showing a structure of a power converter according to a fourth embodiment. A power converter 104 is characteristically different from the power converter 101 in that a one-shot pulse circuit is connected to an input side of a level shift circuit in each stage and a latch circuit is connected to an output side. More specifically, the power converter 104 comprises an input logic circuit 50, a one-shot pulse circuit 51, a buffer 52, a switching element 53, a resistive element 54, a latch circuit 55, a one-shot pulse circuit 56, a buffer 57, a switching element 58, a resistive element 59 and a latch circuit 60 in addition to the components of the power converter 101. In an example of FIG. 7, the switching elements 53 and 58 are n-channel type high voltage MOSFETs in the same manner as the switching elements 13 and 16.

Figure 8:
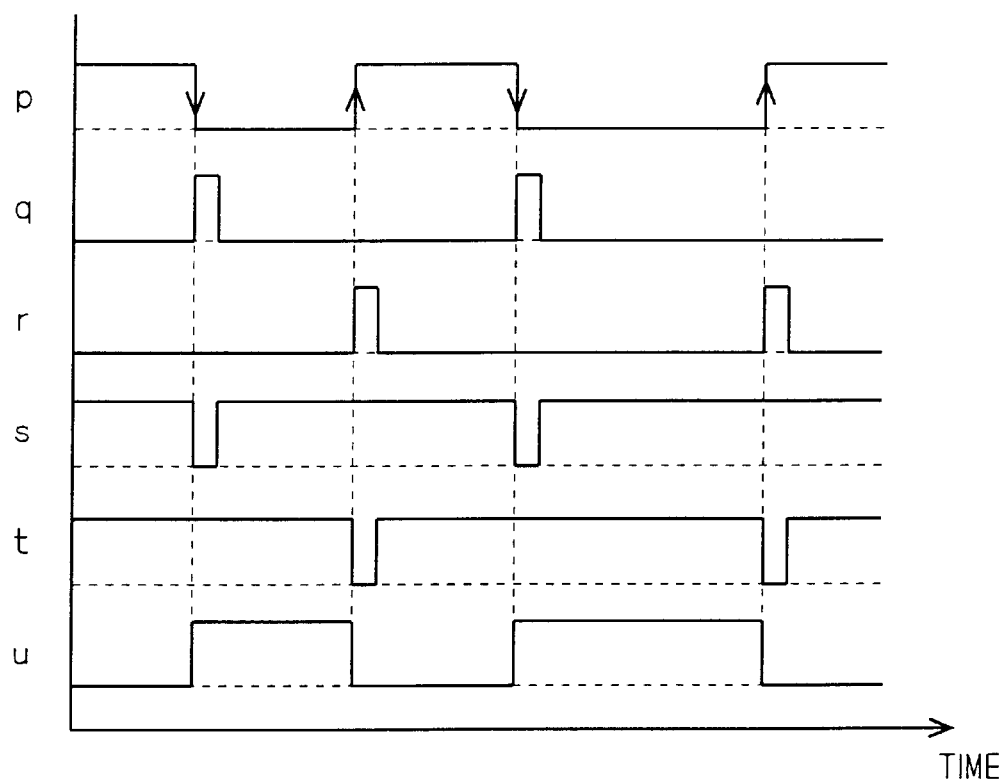
FIG. 8 is a timing chart showing an operation of the power converter in FIG. 7.

FIG. 8 is a timing chart showing a voltage waveform in each of portions (p) to (u) in FIG. 7. A control signal A output from a microcomputer 11 is input to the one-shot pulse circuit 51 (signal p) after subjected to wave shaping by the input logic circuit 50. The one-shot pulse circuit 51 outputs a one-shot pulse (signal q) which is synchronous with a fall of the control signal A and a one-shot pulse (signal r) which is synchronous with a rise. The one-shot pulse (signal q) is level shifted by a series circuit of the switching element 13 and a resistive element 14, and is inverted and is then input to the latch circuit 55 (as signal s). Similarly, the other one-shot pulse (signal r) is level shifted by a series circuit of the switching element 53 and the resistive element 54, and is inverted and is then input to the latch circuit 55 (as signal t). The latch circuit 55 alternately holds (as signal u) values of the input signals (s and t). More specifically, the latch circuit 55 fulfils the function of a conventional well-known SR latch.

The output signal (u) of the latch circuit 55 is equivalent to a signal obtained by level shifting the control signal A in one stage. Similarly, the output signal (u) of the latch circuit 55 is level shifted in another stage through the one-shot pulse circuit 56, a buffer 15 and the buffer 57, the switching elements 16 and 58 and the latch circuit 60. In the same manner as that in the power converter 101, accordingly, the control signal A is level shifted through two-stage level shift circuits and is then input to a driving circuit 3a.

However, a one-shot pulse is input to the switching elements 13, 53, 16 and 58 belonging to a level shift circuit in each stage. Therefore, a period in which an ON state is maintained is shortened. Consequently, it is possible to obtain an advantage that power consumed by the resistive elements 14, 54, 17 and 59, that is, power consumed by the level shift circuit in each stage can be reduced. Since a loss is reduced, the level shift circuit in each stage can also have a simple structure, and furthermore, the reliability of the level shift circuit can also be enhanced.

Figure 9:
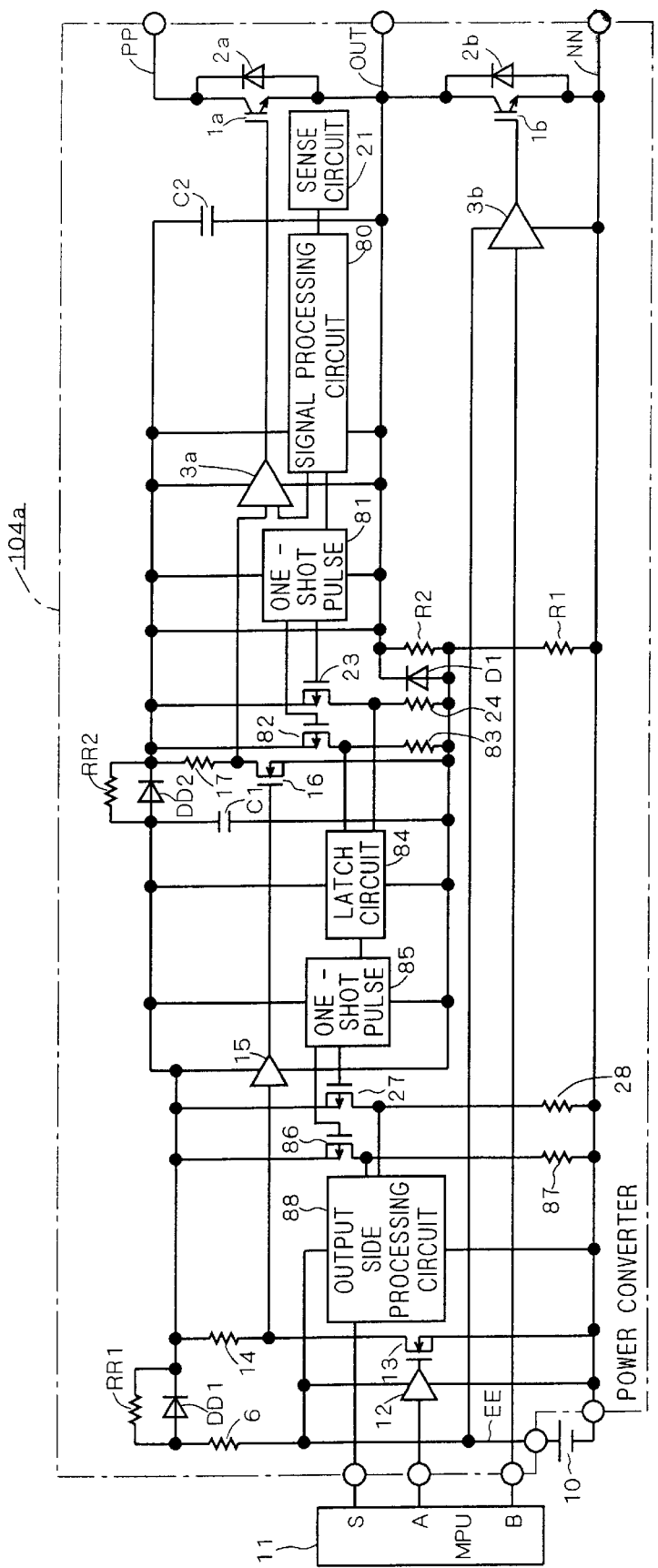
FIG. 9 is a circuit diagram showing a power converter according to another example of the fourth embodiment.

While the one-shot pulse circuit and the latch circuit are provided in a transmission path for the control signal A in FIG. 7, they can also be provided in the transmission path for the detection signal illustrated in FIG. 6. FIG. 9 shows an example of the structure. A power converter 104a is characteristically different from the power converter 103 in that a one-shot pulse circuit is connected to an input side of a level shift circuit in each stage and a latch circuit is connected to an output side. In more detail, the power converter 104a comprises a signal processing circuit 80, a one-shot pulse circuit 81, a latch circuit 84, a one-shot pulse circuit 85 and an output side processing circuit 88 in place of the buffers 22 and 26 and the inverters 25 and 29 in the components of the power converter 103. The power converter 104a further comprises a switching element 82, a resistive element 83, a switching element 86 and a resistive element 87.

In the example of FIG. 9, the switching elements 82 and 86 are p-channel type high voltage MOSFETs in the same manner as the switching elements 23 and 27. The signal processing circuit 80 transmits an output signal of a sense circuit 21 to the driving circuit 3a and the one-shot pulse circuit 81 and includes a buffer, for example. The one-shot pulse circuits 81 and 85 output a one-shot pulse which is synchronous with a fall of an input signal and a one-shot pulse which is synchronous with a rise in the same manner as the one-shot pulse circuits 51 and 56 of the power converter 104. The latch circuit 84 fulfils the function of an SR latch in the same manner as the latch circuits 55 and 60. The output side processing circuit 88 includes a latch circuit for latching output signals of the switching elements 27 and 86 and a buffer circuit for transmitting an output of the latch circuit to a microcomputer 11.

Also in the power converter 104a, it is possible to obtain an advantage that power consumed by the level shift circuit in each stage can be reduced in the same manner as in the power converter 104. Since a loss is reduced, the level shift circuit in each stage can also have a simple structure, and furthermore, the reliability of the level shift circuit can also be enhanced.

Moreover, the one-shot pulse circuit and the latch circuit can also be provided in both the transmission path for the control signal A and the transmission path for the detection signal. Consequently, the consumed power can be reduced more effectively. A power converter in which the one-shot pulse circuit and the latch circuit are provided in both the transmission path for the control signal A and the transmission path for the detection signal is constituted by a combination of the power converter 104 (FIG. 7) and the power converter 104a (FIG. 9), for example.

Fifth Embodiment

Figure 10:
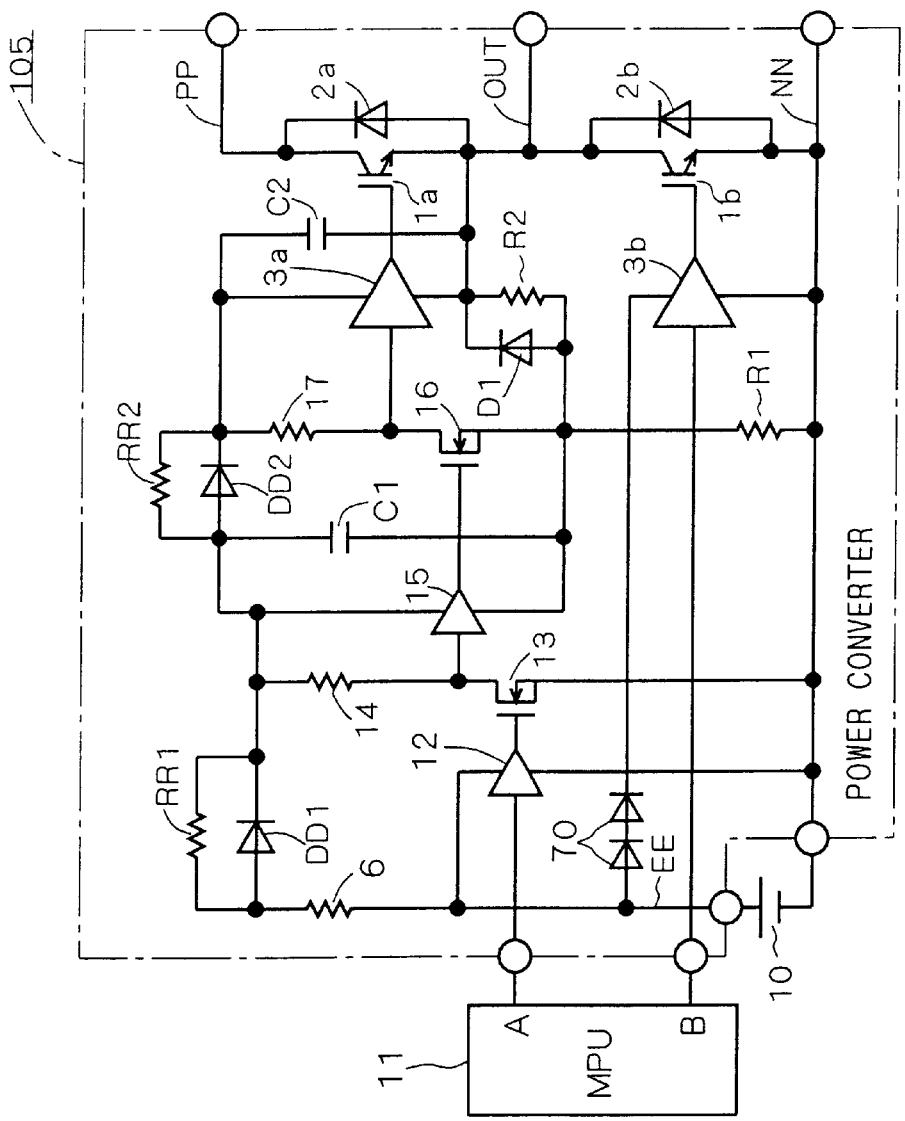
FIG. 10 is a circuit diagram showing a power converter according to a fifth embodiment.

FIG. 10 is a circuit diagram showing a structure of a power converter according to a fifth embodiment. A power converter 105 is characteristically different from the power converter 101 in that two diodes 70 are provided between a d.c. power line EE and a power terminal of a driving circuit 3b. More specifically, one of the power terminals of the driving circuit 3b is connected to a low potential power line NN and the other power terminal is connected to the d.c. power line EE through the diodes 70. A pair of power terminals of a driving circuit 3a are connected to ends of a capacitor C2, respectively. Therefore, a source voltage of the driving circuit 3a is lower than a d.c. voltage (for example, 15 V) supplied from a d.c. power source 10 because of forward voltages of diodes DD1 and DD2. In the power converter 105, a source voltage of the driving circuit 3b is also lower than the d.c. voltage supplied from the d.c. power source 10 because of a forward voltages of the diodes 70. Therefore, a difference between the source voltages supplied to the two driving circuits 3a and 3b is reduced or canceled. In a general power converter comprising level shift circuits in n stages, the number of diodes 70 is set to n.

Sixth Embodiment

In the power converters 101 to 105 according to the first to fifth embodiments, it is desirable that a specific device portion should be formed on a single chip or formed as an IC (integrated circuit). In a sixth embodiment, preferable examples of a single chip and an IC will be shown as to the power converter 101 according to the first embodiment. For the power converters 102 to 105, similar integration into a single chip and an IC can also be carried out.

Figure 11:
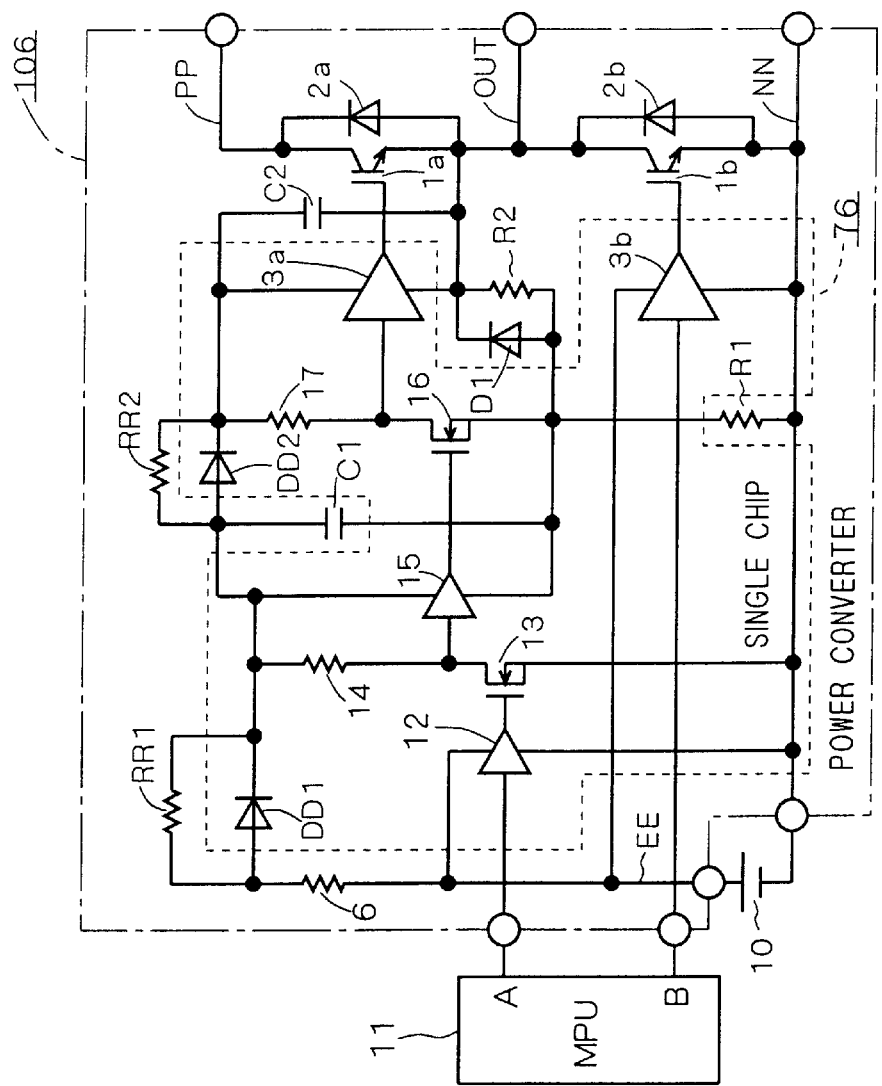
FIG. 11 is a circuit diagram showing a power converter according to a first example of a sixth embodiment.

In a power converter 106 shown in FIG. 11, circuit elements excluding power switching elements 1a and 1b, free wheel diodes 2a and 2b, capacitive elements C1 and C2, resistive elements R1 and R2, a diode D1 and resistive elements 6, RR1 and RR2 are fabricated into a single chip 76 in FIG. 11. Consequently, a size of the device can be reduced.

Figure 12:
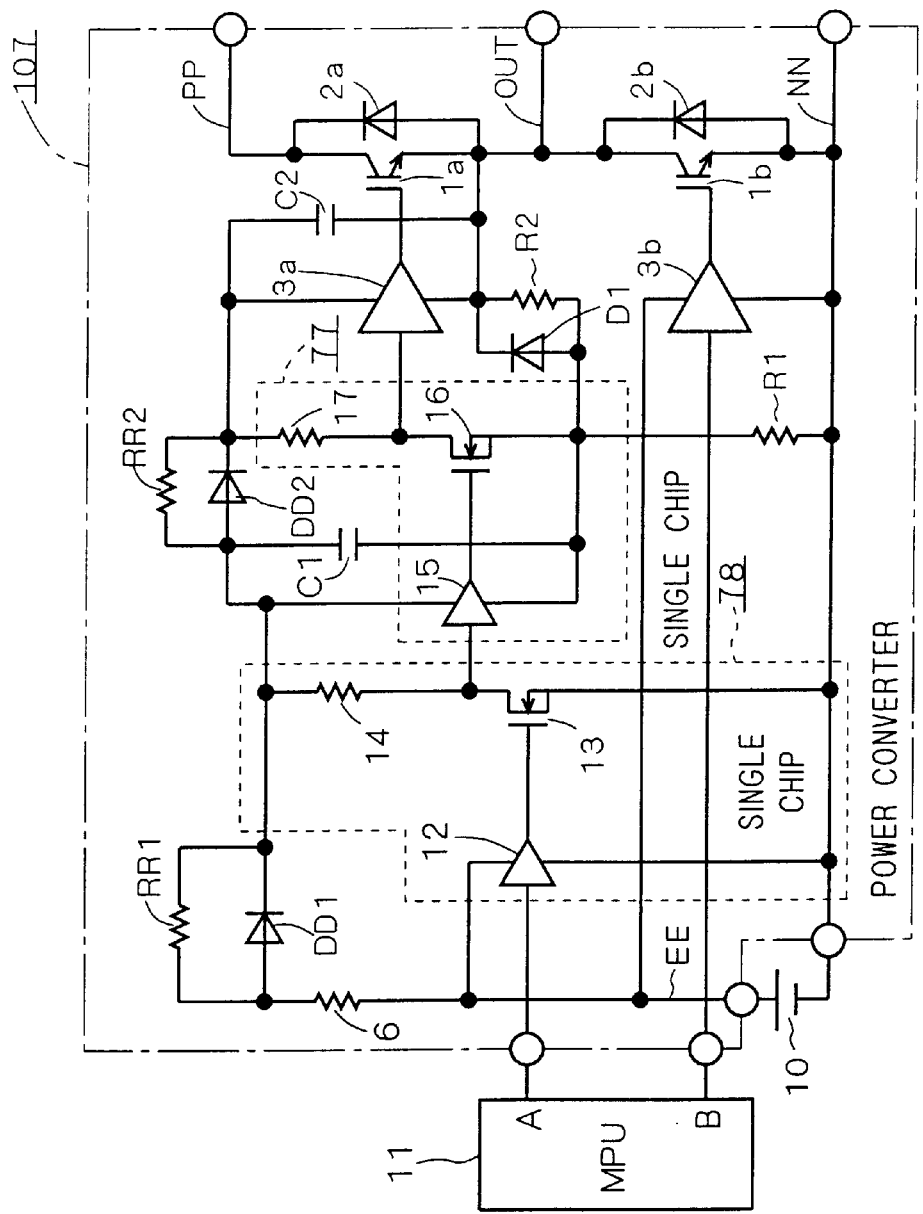
FIG. 12 is a circuit diagram showing a power converter according to a second example of the sixth embodiment.

In a power converter 107 shown in FIG. 12, a buffer 12, a switching element 13 and a resistive element 14 are fabricated into a single chip 78 and a buffer 15, a switching element 16 and a resistive element 17 are fabricated into another single chip 77. Consequently, the device can be standardized and can become flexible.

Figure 13:
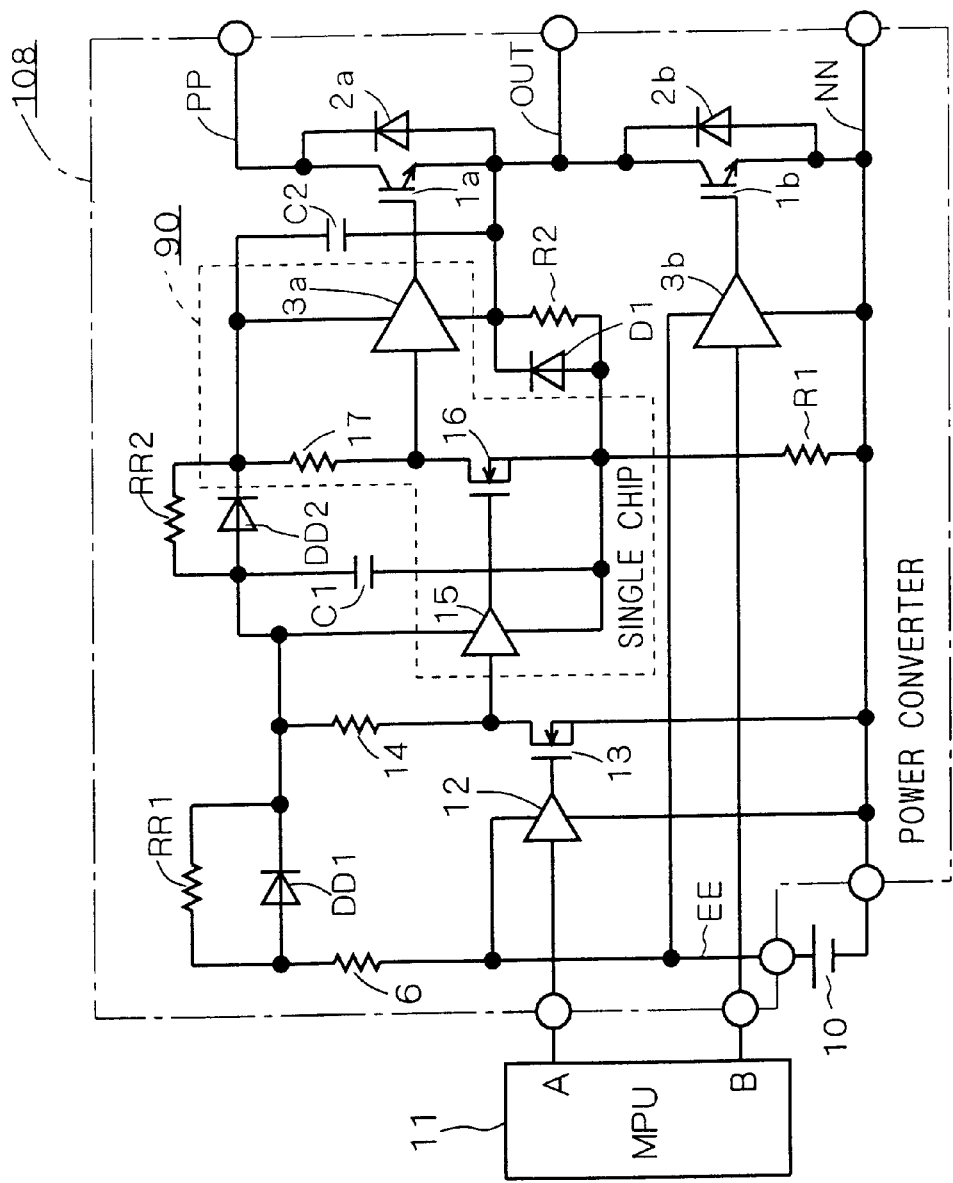
FIG. 13 is a circuit diagram showing a power converter according to a third example of the sixth embodiment.

In a power converter 108 shown in FIG. 13, the buffer 15, the switching element 16, the resistive element 17 and a driving circuit 3a are fabricated into a single chip 90. Consequently, the device can be standardized and can become flexible.

Figure 14:
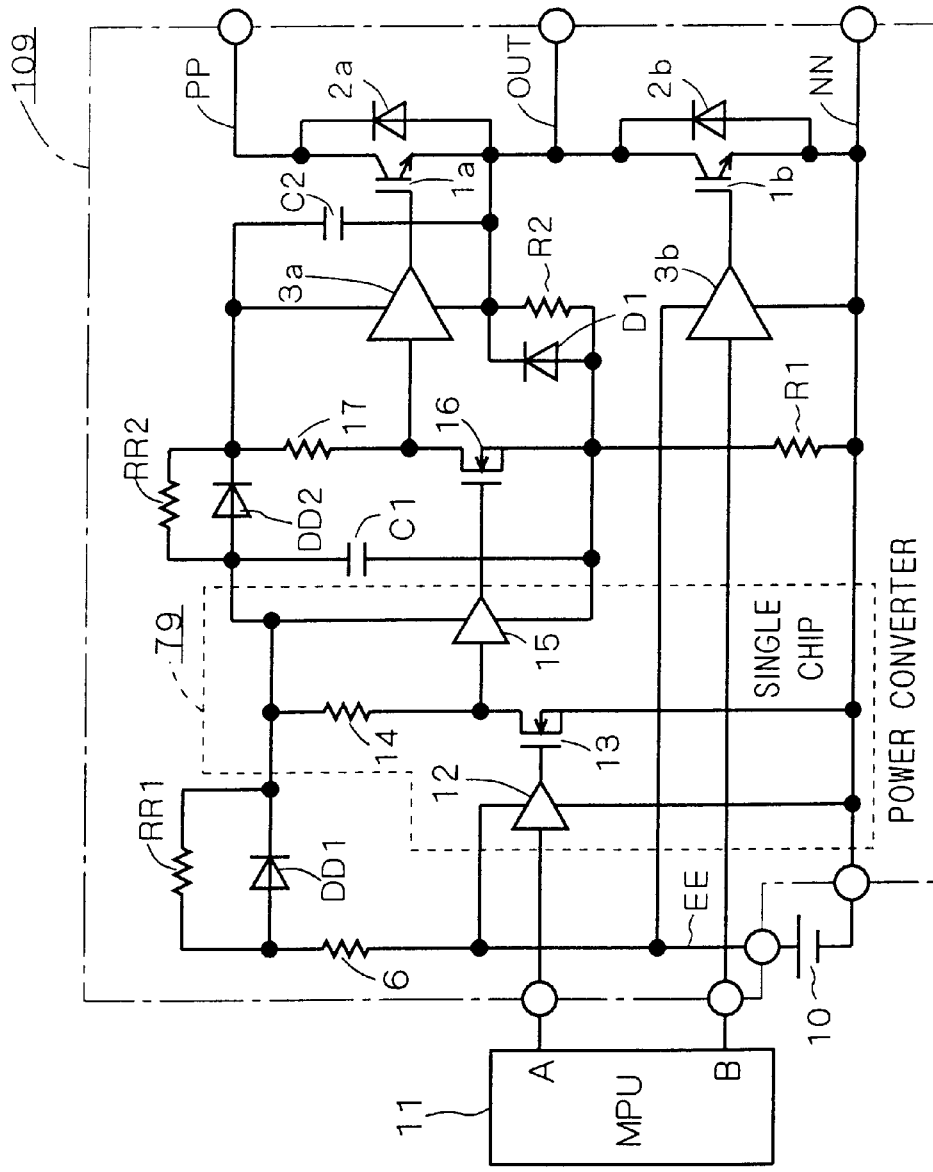
FIG. 14 is a circuit diagram showing a power converter according to a fourth example of the sixth embodiment.

In a power converter 109 shown in FIG. 14, the buffer 12, the switching element 13, the resistive element 14 and the buffer 15 are fabricated into a single chip 79. Consequently, the device can be standardized and can become flexible.

Figure 15:
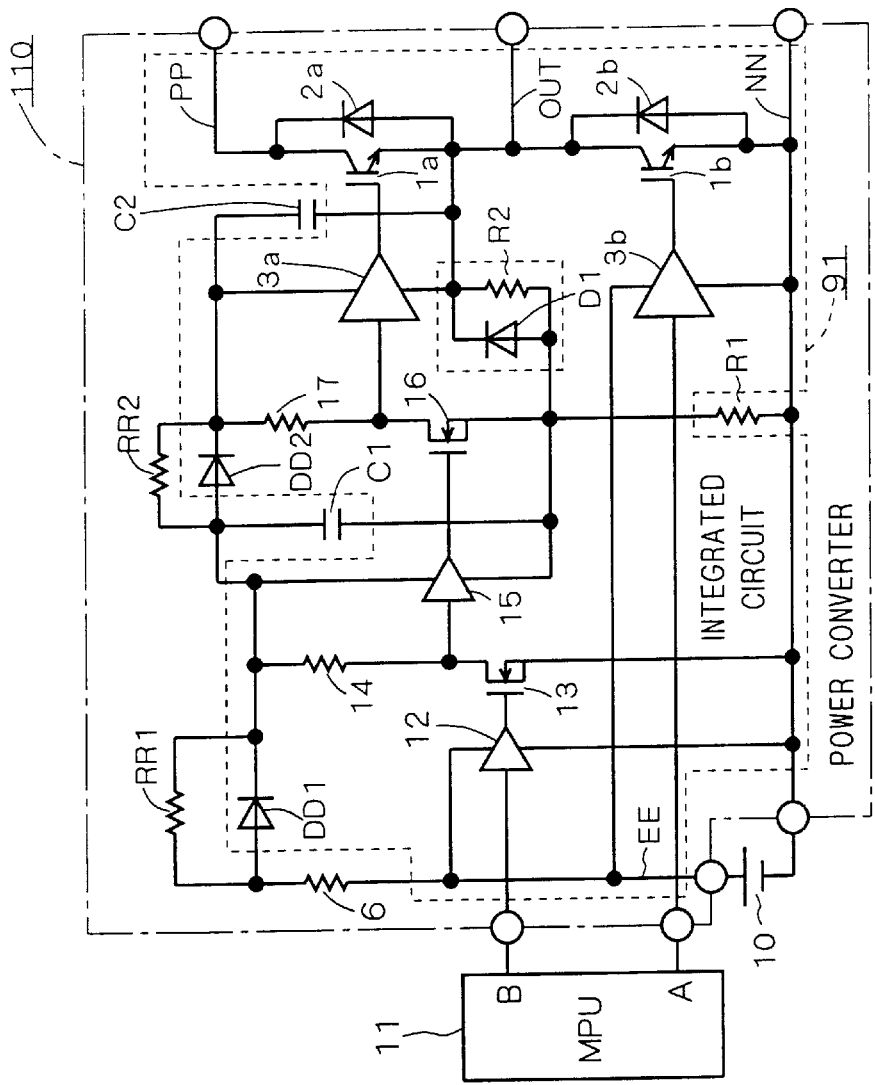
FIG. 15 is a circuit diagram showing a power converter according to a fifth example of the sixth embodiment.

In a power converter 110 shown in FIG. 15, circuit portions excluding the capacitive elements C1 and C2, the resistive elements R1 and R2, the diode D1 and the resistive elements 6, RR1 and RR2 are changed into an IC 91 in FIG. 15. Consequently, the size of the device can be reduced.

Variant

The power converter according to each of the embodiments described above can be practiced by combining the features thereof with each other. In the power converter according to the present invention, moreover, it is also possible to widely employ signal level conversion circuits for level shifting a signal stepwise in a plurality of stages other than the signal level converting circuit shown in FIG. 1.

While the invention has been shown and described in detail, the foregoing description is in all aspects illustrative and not restrictive. It is therefore understood that numerous modifications and variations can be devised without departing from the scope of the invention.

What is claimed is:

1. A power converter comprising:

a first switching element having first and second main electrodes;

a second switching element having third and fourth main electrodes, said fourth main electrode being connected to said first main electrode;

a first driving circuit to drive said first switching element based on a first control signal input from an outside;

a second driving circuit to drive said second switching element based on a second control signal input from an outside; and n level shift circuits connected in cascade in n stages, said n being an integer of 2 or more, and configured to level shift said first control signal in said n stages and to transmit said level shifted signal to said first driving circuit.

2. The power converter according to claim 1, further comprising a sense circuit to detect an operation state of said first switching element and to output a detection signal representing said operation state; and n other level shift circuits connected in cascade in n stages and configured to level shift said detection signal in said n stages and to transmit said level shifted signal to an outside.

3. The power converter according to claim 2, further comprising a one-shot pulse circuit connected to an input of each of said n other level shift circuits; and a latch circuit connected to an output of each of said n other level shift circuits.

4. The power converter according to claim 2, wherein each of said n other level shift circuits includes a resistive element and a switching element which are connected to each other in series.

5. The power converter according to claim 1, wherein each of said n level shift circuits includes a resistive element and a switching element which are connected to each other in series.

6. The power converter according to claim 1, further comprising a one-shot pulse circuit connected to an input of each of said n level shift circuits; and a latch circuit connected to an output of each of said n level shift circuits.

7. The power converter according to claim 1, further comprising a voltage dividing circuit having one end connected to said third main electrode and the other end connected to said first main electrode and configured to divide an electric potential of said one end and an electric potential of said other end, thereby outputting first to (n−1)th intermediate potentials;

first to nth diodes connected to each other in series in the same direction; and first to nth capacitors, wherein one end of said first to nth capacitors are respectively connected to one electrode of said first to nth diodes, and the other end of said first to nth capacitors are connected to an output of said first to (n−1)th intermediate potentials and said first main electrode, respectively.

8. The power converter according to claim 7, wherein said voltage dividing circuit includes first to nth resistive elements which are connected to each other in series, and said first to (n−1)th intermediate potentials are output from (n−1) connecting portions from said first to nth resistive elements, respectively.

9. The power converter according to claim 8, further comprising (n−1) diodes connected to said second to nth resistive elements in parallel, respectively.

10. The power converter according to claim 7, further comprising n diodes connected to each other in series, a pair of power terminals of said first driving circuit being connected to said one end of said nth capacitor and said other end thereof, respectively, and one of a pair of power terminals of said second driving circuit being connected to said third main electrode and the other of said pair of said power terminals being connected to one end of a series circuit of said n diodes.

11. The power converter according to claim 7, further comprising n resistive elements connected to said first to nth diodes in parallel, respectively.

12. The power converter according to claim 7, further comprising another resistive element connected to said first diode in series.

13. The power converter according to claim 1, further comprising first and second free wheel diodes connected to said first and second switching elements in antiparallel, respectively.

* * * * *